United States Patent
Cohen

(10) Patent No.: US 6,278,963 B1
(45) Date of Patent: Aug. 21, 2001

(54) SYSTEM ARCHITECTURE FOR DISTRIBUTION OF DISCRETE-EVENT SIMULATIONS

(75) Inventor: Alain Cohen, Washington, DC (US)

(73) Assignee: OPNET Technologies, Inc., Bethesda, MD (US)

( * ) Notice: Subject to any disclaimer, the term of this patent is extended or adjusted under 35 U.S.C. 154(b) by 0 days.

(21) Appl. No.: 09/108,503

(22) Filed: Jul. 1, 1998

Related U.S. Application Data

(60) Provisional application No. 60/052,778, filed on Jul. 1, 1997.

(51) Int. Cl.⁷ .............................. G06F 17/50; G06G 7/62
(52) U.S. Cl. ................................................. 703/17; 703/16
(58) Field of Search ................................. 703/4, 14, 15, 703/16, 17

(56) References Cited

U.S. PATENT DOCUMENTS

| | | | |
|---|---|---|---|
| 4,866,663 | 9/1989 | Griffin | 364/900 |
| 4,901,260 | 2/1990 | Lubachevsky | 395/500.38 |
| 4,916,647 | 4/1990 | Catlin | 364/578 |
| 4,965,743 | 10/1990 | Malin et al. | 364/513 |
| 4,980,824 | 12/1990 | Tulpule et al. | 364/200 |
| 5,140,537 | 8/1992 | Tullis | 364/578 |
| 5,170,355 | 12/1992 | Hadavi et al. | 364/468 |
| 5,247,650 | 9/1993 | Judd et al. | 395/500 |
| 5,272,651 | 12/1993 | Bush et al. | 364/578 |
| 5,307,479 | 4/1994 | Ulrich et al. | 395/500 |
| 5,375,074 | 12/1994 | Greenberg et al. | 364/578 |
| 5,442,758 | 8/1995 | Slingwine et al. | 395/375 |
| 5,442,772 | 8/1995 | Childs et al. | 395/500 |
| 5,467,462 | 11/1995 | Fujii | 395/500.37 |
| 5,471,622 | 11/1995 | Eadline | 395/650 |
| 5,519,848 | 5/1996 | Wloka et al. | 395/500 |
| 5,544,348 | 8/1996 | Umeda et al. | 395/500.38 |
| 5,655,107 | 8/1997 | Bull | 395/500.34 |
| 5,694,579 | 12/1997 | Razdan et al. | 395/500.35 |
| 5,701,439 | 12/1997 | James et al. | 395/500.38 |
| 5,790,829 | 8/1998 | Flynn | 395/500.38 |

Primary Examiner—Kevin J. Teska
Assistant Examiner—Samuel Broda
(74) Attorney, Agent, or Firm—Venable; Michael A. Sartori

(57) ABSTRACT

A method, an apparatus, and a computer-readable medium for performing a discrete-event simulation employs an event list comprising events. In the event list, one event is indicated as a head event, and each event is indicated as uncomputed, pre-computed, or in-computation. An uncomputed event is selected and transferred to one of at least one event pre-computation processes, which computes a computation for the selected uncomputed event. An uncomputed head event is executed, and a pre-computed head event is verified.

28 Claims, 1 Drawing Sheet

SYSTEM ARCHITECTURE FOR DISTRIBUTION OF DISCRETE-EVENT SIMULATIONS

CROSS-REFERENCE TO RELATED APPLICATION

This application claims the benefit of U.S. Provisional Patent Application Ser. No. 60/052,778, filed Jul. 1, 1997, which is incorporated herein by reference.

FIELD OF THE INVENTION

The invention relates generally to discrete-event simulation (DES) and parallel processing.

BACKGROUND OF THE INVENTION

A general model of a DES is described, and is not specifically oriented to any particular simulation application domain. DES is discussed in terms of objects and events, event inputs and outputs, and time and event execution of a DES.

Objects and Events

A DES attempts to predict or reproduce the behavior of a specified system by decomposing the behavior into a sequence of state changes. Each state change for the system, and each instant in time at which a state change would be possible, is referred to as an "event."

In general, the simulated system consists of a collection of system components, referred to as "objects." Objects may be static entities (permanent and predefined) or dynamic entities (created and destroyed as needed). Each object can maintain its own private state. This is referred to as "object local state." In addition, the system may have a state that belongs to no particular object. This is referred to as a "system global state."

Without loss of generality, an event is typically associated with a particular object. If, in a particular DES application, it is possible to have a single event associated with multiple objects, this system can be reduced to the general model by decomposing such events into a series of events for individual objects. In addition, if it is possible to have events associated with no particular object, a special "global object" is created to be the recipient of such events. Therefore, under the general model for a DES, exactly one object is considered "active" in response to an event. This object is called the "active object."

Event Inputs and Outputs

During an event, the new state of the system is computed as a function of some subset of the DES's state, referred to as the event's "inputs." Although the event is associated with a single object, any part of the system's state may be examined during the event's computation. This includes the object local state for this and other objects, as well as the system-global state and other information, as described in Table 1.

TABLE 1

Possible Event Inputs object local state for active object
object local state for other objects
system global state
current event specifics The term "event specifics" refers to a collection of information that describes the event that is to occur. It may include data that is "delivered" with the event, for instance, or it may represent the nature of the event itself. It should be noted that only causal DES's are considered. This means that event computations cannot be affected by information contained in future events and, therefore, future event specifics are not permitted as event inputs.

During the event, the state of the system may change in several ways. The primary agent of change is the active object, which is able to perform "actions." In addition, the parts of the DES which manage the objects and the simulation global state are able to effect state changes as well. Collectively, these parts of the DES are referred to as the "simulation kernel." The simulation kernel is essentially the infrastructure of the DES, and is typically not specific to the particular system being simulated, although it may be, in the case of a dedicated simulation.

All system state changes are referred to as "event outputs." A list of event outputs is given in Table 2. These event outputs are essentially the significant results of carrying-out an event. It should be noted that insertion and deletion of new events to occur in the future are considered event outputs. Insertion of new events is the mechanism that feeds new work to the DES, allowing it to continue executing into the future. The set of future events is considered a special subset of the system global state, but is explicitly mentioned because it is a core state component in all DES's.

TABLE 2

Possible Event Outputs active object local state change
other object local state change
system global state change
insertion of future events
deletion of future events Time and Event Execution Events in the DES are stored in a structure referred to as the "event list." The event list acts externally as a list in the sense that the events form a sequence $E[0], E[1], \ldots E[n]$. However, the actual underlying implementation may rely on more complex data structures to improve efficiency. Events are tagged with the simulation time at which they are scheduled to occur, or "be executed," and the events can be extracted from the event list in order of monotonically increasing simulation time. Conceptually, the event list looks like Table 3.

TABLE 3

| Time | Event |
|---|---|
| 0.0 | E [0] |
| 0.1 | E [1] |
| 0.1 | E [2] |
| 1.0 | E [4] |
| 1.00000001 | E [5] |
| 1.00000002 | E [6] |
| 100.0 | E [7] |

At the start of the simulation, special "initial events" are inserted into the event list. As an event is executed, the active object can cause zero, one, or more additional events to be inserted into the event list, or "scheduled." The active object can schedule a new event for an arbitrary time in the future, including the special case of the same exact simulation time as the current event.

If there is only one event left, and it generates no additional events, it is possible that the event list will become empty. This is one of several conditions causing the DES to terminate.

Simulation time is defined as the time of the event that is currently executing. Therefore, simulation time "jumps" by typically irregular intervals throughout the simulation, as shown on the time axis of FIG. 1. Some DES's fall into a category called "time-stepped," which means that all events are evenly separated on the time axis (i.e., E[n+1]−E[n] is a constant). This is merely a special case of the more general "event-scheduled" approach described above, which allows arbitrary spacing between events.

The events in a DES are conventionally executed serially. The conventional architecture for execution of a DES maintains the events in a structure that provides list-like access to the events. Events are removed one at a time from the list for execution. All available computing resources are devoted to the computation of that event until it is completed, at which time the next event may begin processing. The events are typically maintained in an ordered state to allow constant-time access to the earliest event when it is time to begin a new execution. Such a conventional system is called a "serial event execution" (SEE) DES. In such a conventional system, the significant sources of computation are listed in Table 4.

TABLE 4

Computation breakdown for a single event in a SEE DES

| source | variable |
|---|---|
| time for extraction from the event list and dispatch to event computation code | d |
| time for computations occurring in main body of the event | c |
| time for insertion of new events into the event list | i |
| number of new events scheduled during the given event | n |

Given the definitions in Table 4, the mean time required to completely process an event in an SEE DES is:

$$X = d + c + (n \cdot i)$$

where d is the average d, c is the average c, n is the average n, and i is the average i.

In the steady state, because the event list has a stable size, the average number of new events inserted into the event list during each event is one. Hence, X reduces to a simple sum of d, c, and i. Because the list can be ordered, d is essentially a very small constant time required to remove the head event of the list and call an appropriate handler for the head event. Further, c depends primarily on the complexity of the events being simulated, and can be assumed to be a given value for a particular class of simulation problems. Moreover, i is a function of the strategy used to manage the event list, since it requires ordered placement in the event list structure.

Optimization of d and i are straightforward problems and most conventional DES's are efficient with respect to these variables. Hence, to improve simulation run times, attention must be turned to reducing c. To reduce c, programmers must implement event computations as efficiently as possible. Once this has taken place, little can be done to accelerate simulations under the SEE paradigm, short of using a higher speed processor.

Therefore, within a given problem area, and on a given processor, the SEE DES has a natural bound on its event throughput. To improve further, the event throughput must be increased. In general, all alternatives to SEE rely on concurrently processing multiple events by distributing them over multiple processors. A number of approaches have been proposed to accomplish this, and have been implemented in experiments or commercial products. Each has its advantages, making it applicable to a particular class of simulation problems, but none of these are able to increase the event throughput dramatically in the general case, and each presents disadvantages and difficulties in implementation and execution.

SUMMARY OF THE INVENTION

An object of the invention is to provide increased event throughput for a DES using a single event list.

A further object of the invention is to provide an architecture for implementing parallel simulations usable with any particular computer hardware implementation.

An additional object of the invention is to provide a technique for accelerating the execution of DES's via concurrent use of multiple processors.

Another object of the invention is to provide a DES in which the simulation programmers or users are unaware of the underlying event-processing architecture of the DES. For instance, the simulation programmers or users do not need to consider how to physically partition the DES system in order to allocate sub-parts to available processors. Instead, the invention automatically scales to take advantage of additional processors and reduces to a traditional DES when only one processor is available.

The present invention can be embodied in a number of ways, including, but not limited to: a method; an apparatus comprising a computer system; and a computer-readable medium embodying a computer program.

The invention embodied in a method comprises a method for increasing the event throughput of a discrete-event simulation comprising maintaining an event list for the discrete-event simulation, the event list having a head event; and determining whether the head event is uncomputed, in-computation, or pre-computed. If the head event is determined to be uncomputed, the head event is executed. If the head event is determined to be in-computation, the head event is indicated as pre-computed upon completion of a computation for the head event. If the head event is determined to be pre-computed, it is determined whether the computation of the head event is valid or invalid. If the computation of the head event is determined to be valid, the computation of the head event is applied, and if the computation of the head event is determined to be invalid, the head event is executed.

For the method, the discrete-event simulation has a current system state, and applying the computation of the head event comprises changing the current system state based on the computation of the head event. Further, determining whether the computation of the head event is valid or invalid can use input invariance. Moreover, the event list can be an ordered collection of events. In addition, the event list includes a plurality of events and at least one event indicated as uncomputed, and the method further comprises selecting the uncomputed events from the event list, and computing computations for the uncomputed events.

The invention embodied in another method comprises a method for increasing the event throughput of a discrete-event simulation comprising maintaining an event list for the discrete-event simulation, the event list having a plurality of events and at least one event indicated as uncomputed, selecting an event indicated as uncomputed from the event list, assigning the selected event to an event pre-computation process, indicating the selected event in the event list as in-computation, computing a computation for the selected event using the event pre-computation process, receiving the computation from the event pre-computation process, and indicating the selected event in the event list as pre-computed.

For the method, computing a computation for the selected event using the event pre-computation process comprises providing the event pre-computation process with event inputs, and determining a change to the system state based on the selected event and the event inputs. Receiving the computation from the event pre-computation process comprises receiving the event inputs and the change to the system state from the event pre-computation process, and indicating the selected event in the event list as pre-computed comprises associating the event inputs and the change to the system state with the selected event.

Further, the method further comprises: indicating the selected event as a pre-computed head event in the event list; and verifying the head event to determine if the head event is valid or invalid by comparing the current system state with the event inputs associated with the head event. If the head event is valid, the computation of the head event is applied by updating the current system state using the change to the system state associated with the head event. If the head event is invalid, the head event is executed.

The invention embodied in a further method comprises a method for increasing the event throughput of a discrete-event simulation comprising maintaining an event list for the discrete-event simulation, the event list having a plurality of events indicated as pre-computed, selecting an event indicated as pre-computed from the event list, and determining whether the selected event is valid or invalid. If the selected event is invalid, the selected event is assigned to an event pre-computation process, the selected event in the event list is indicated as in-computation, a computation for the selected event is computed using the event pre-computation process, the computation is received from the event pre-computation process, and the selected event in the event list is indicated as pre-computed.

The invention embodied in an apparatus comprises a computer system for performing a discrete-event simulation comprising: means for maintaining an event list comprising a plurality of events, one event being indicated as a head event, each event being indicated as uncomputed, in-computation, or pre-computed; means for carrying out at least one event pre-computation process for computing a computation for an uncomputed event; means for selecting an uncomputed event, and transferring the uncomputed event to one of the event pre-computation processes; and means for executing uncomputed events and verifying pre-computed events.

For the apparatus, at least one processor can implement the means for maintaining an event list, the means for selecting an uncomputed event and transferring the uncomputed event, and the means for executing uncomputed events and verifying pre-computed events. Moreover, a plurality of processors can implement the means for computing a computation for an uncomputed event.

For the invention, the computer system comprises a computer or a plurality of computers connected over a network. Further, each computer in the computer system can have a processor or a plurality of processors.

The invention embodied in an article of manufacture comprises a computer-readable medium embodying code segments for performing a discrete-event simulation. The code segments comprise: a code segment of maintaining an event list having a plurality of events including a head event, each event indicated as uncomputed, in-computation, or pre-computed; a code segment for each of at least one event pre-computation process for computing a computation for an uncomputed event; a code segment for an event list scanning process for scanning the event list, selecting an uncomputed event, and assigning the uncomputed event to one of the event pre-computation processes to have a computation computed according to the code segment for the event pre-computation process; and a code segment for an event list manager for executing uncomputed events and verifying pre-computed events.

For the invention, the computer-readable medium embodying the computer program comprises code segments to control a processor or a plurality of processors to perform the invention. Non-limiting examples of a "computer-readable medium" include a magnetic hard disk, a floppy disk, an optical disk, a magnetic tape, a memory chip, and a carrier wave used to carry electronic data, such as those used in transmitting and receiving electronic mail or in accessing an electronic data network, such as the Internet. Further, non-limiting examples of "code segments" include software, instructions, computer programs, or any means for controlling a processor or a plurality of processors.

BRIEF DESCRIPTION OF THE DRAWINGS

Embodiments of the invention are explained in greater detail by way of the drawings.

DETAILED DESCRIPTION OF THE INVENTION

The invention uses selective pre-computation of events (SPE) as an acceleration mechanism that works within the paradigm of a single event list. With the invention, the management of the events remains centralized with one processor, and the execution of the events is distributed to other available processors.

SPE uses the conventional event list and relies on a single process, or thread, called the "event list manager" (ELM) to execute the events in the list. (The term "process" refers to one or more computer programs running on one or more processors.) SPE also relies on additional processes, which may run on other processors, to "pre-compute" events whenever possible to increase the event throughput. These processes are referred to as "event pre-computation processes" (EPP's). In one embodiment of the invention, each EPP is run on a separate processor. The goal of SPE is to assign as many future events as possible to free processors for concurrent execution and to store the "work," or computation, performed by these processors in the hope that the work will remain valid and usable when the event's actual simulation time is reached.

As in the standard event-processing architecture, ordinary events enter the event list of the invention to await execution. The event list is scanned by an "event-list scanning process" (ESP), which selects certain events for pre-computation. ESP can be implemented, for example, as a sub-task of ELM. Events can be in one of three categories at any time: uncomputed events (UCE's), in-computation events (ICE's), and pre-computed events (PCE's). A PCE whose associated work remains valid until its actual execution time is called a usable pre-computed event (UPCE). These four types of events are defined in Table 5.

TABLE 5

Event Classification in SPE

| Event Class | Definition |
| --- | --- |
| UCE | Uncomputed Events. These are events that have either not yet been visited by ESP, or ones that were not chosen for pre-computation. |
| ICE | In-computation Events. These are events that have been chosen by ESP and have begun but not completed pre-computation. |
| PCE | Pre-Computed Events. These are events that have successfully completed pre-computation. |
| UPCE | Usable PCE's. A PCE whose pre-computed work can be utilized at the time when it matures (i.e., the PCE becomes the head event of the event list). |

Figure 1:
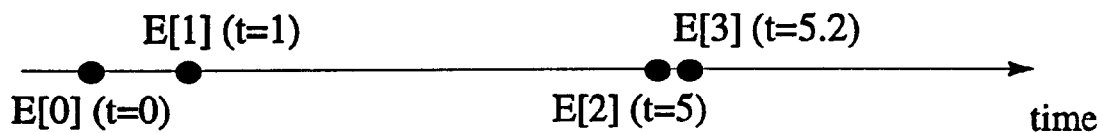
FIG. 1 illustrates irregular event spacing for a DES along a time axis.
Figure 2:
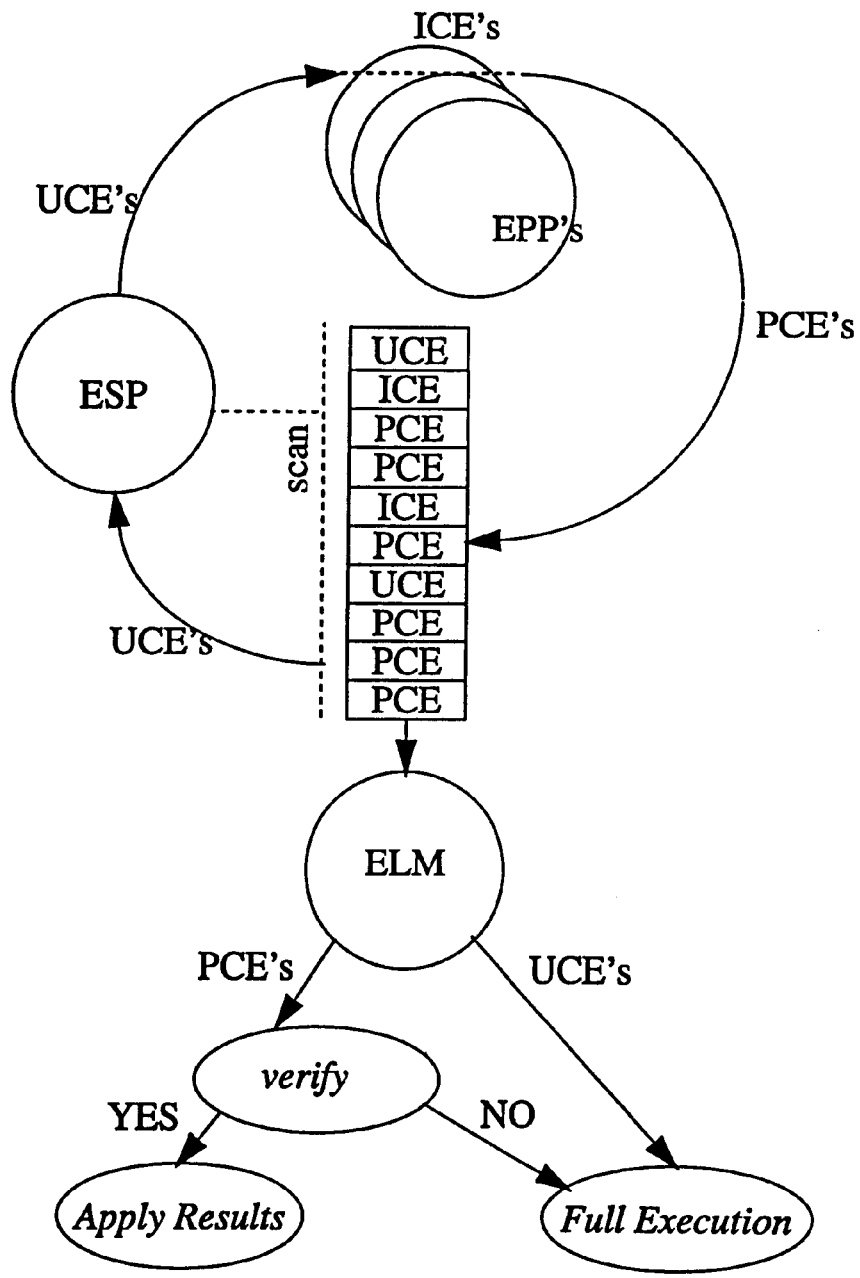
FIG. 2 illustrates event processing using the selective pre-computation of events architecture of the invention.

FIG. 2 illustrates event processing using the SPE architecture of the invention. ESP scans the event list for any UCE's. If a UCE is found, the ESP forwards the UCE to an EPP for processing, and the indication of the UCE in the event list is changed from UCE to ICE. Once the EPP finishes, the resulting PCE is output, and the ICE in the event list is changed to a PCE.

All events, regardless of their state, continue to be represented in the event list until executed. Execution can only occur when an event reaches the head of the event list, and is then referred to as the head event. At that point, the event's processing will depend on its state. In FIG. 2, the head event is depicted at the bottom of the event list and is indicated to be a PCE.

As illustrated in FIG. 2, there are three possible scenarios for the head event. First, if the head event is a UCE, the head event will be processed, as in the SEE architecture, by the process in charge of managing the event list.

Second, if the head event is an ICE, additional event execution by the ELM cannot proceed until the head event becomes a PCE. If ELM did proceed, the causal relationship between events may break down. The ELM can either block further processing until the pre-computation completes or use the time to scan the event list in order to select other events for pre-computation.

Third, if the head event is a PCE (which is depicted in FIG. 2), the ELM must verify that the pre-computation work has remained valid (i.e., that the head event is also a UPCE). If the head event is a UPCE, event execution consists only of an "application" of the stored results. In other words, recorded event outputs are used to modify the system state.

Inputs of Event Computations

When an event's computation occurs, regardless of whether the event is pre-computed by an EPP in the SPE architecture or directly computed by the ELM, the event relies on the same set of "event inputs." The term "event inputs" refers to the collection of all components of state information stored in any part of the DES which may be analyzed during the event computation.

The invention increases the throughput of the DES by having the ELM validate events computed by the EPP's, rather than having the ELM compute the events. With the invention, the event throughput of the DES is a function of how fast a single processor can validate events rather than how fast a single processor can compute events fully. A condition for the invention providing enhanced performance is that validating events is simpler than fully computing events. Hence, the PCE validation mechanism is a critical part of the SPE architecture.

Knowledge of which inputs were used during an event's pre-computation is necessary in order to determine whether the pre-computation will yield identical results when compared with a direct execution of the event by the ELM. Any change in these inputs may result in a different computation of the event, and should be conservatively considered to invalidate the pre-computation. Requiring that no intervening modification of inputs occurs is a simple approach for an SPE-based system to validate pre-computed events. This approach is referred to as "input invariance." When an event begins execution, it is generally impossible to determine in advance which of the inputs will be accessed. This is particularly true in a system that supports general instructions during an event, including conditional control flow. Therefore, implementing input invariance requires some method of detecting and retaining which inputs were used during pre-computation.

Depending upon the nature of a change to the inputs of an event and the way in which the inputs are used, it is possible that the event would unfold in the exact manner despite the change. Input invariance is, therefore, a conservative approach to implementing validation in an SPE DES. More sophisticated validation schemes can consider more detailed information about the use of event inputs, and thereby relax the conditions required for validation.

Outputs of Event Computations

During an event's execution, many different actions can occur. Certain actions can be considered to be strictly internal to the event, and have no repercussion on any other event. Internal actions may be the modification of a temporary variable used in a local computation, for example. Because internal actions do not affect other events, such internal actions can be performed as part of a pre-computation without any need to "remember" that they occurred.

Events may also include actions with external effects. These external actions, or event outputs, must be made to occur in a manner which does not interfere with other ongoing or future event computations. The SPE approach to this issue is one of several factors differentiating the invention from other conventional simulation architectures.

Each event output can cause one or more changes to the state of the DES. If an event B is being computed as a PCE, allowing these changes to occur will modify the view of the system state perceived by other ongoing event computations. Furthermore, allowing the changes to occur will modify the system state as perceived by PCE computations that would occur between the initial execution and the final execution of the event E.

In the SPE architecture of the invention, event outputs are essentially "buffered" until such time as they can be safely applied to the actual system state. This means that the changes occur, but that they are not allowed to affect the system state until the time of final event execution. As discussed above, if the PCE is determined to be invalid according to criteria, such as input invariance, all changes are discarded. Thus, the changes occur in a special context in such a manner as to satisfy two requirements.

First, sufficient information must be recorded about the output to be able to reproduce the output identically at execution time. Actual implementation of the action occurs during the "apply results" phase, as illustrated in FIG. 2, provided that verification is successful.

Second, actual application of the output must be temporarily emulated in order to present a consistent view of the simulation state during the event's pre-computation. For example, if an object modifies one of the object's attributes, and then queries its value during the same event (and optionally also later PCE's), the newly assigned value will be obtained from the query. Thus, the event-processing methods associated with each object are shielded from having to know if the methods are executing for pre-computation or for direct computation.

Given the second requirement, two differing views of the system state (or a subset of the system state) will temporarily coexist. One will be in force in the context of the PCE of interest, and the other will be in force in the context of final event execution by the ELM. However, this leaves open the question of which of these views will be in force for events that occur between these two times. Using either of the two views can provide a correct solution, since the validation mechanism employed at final event execution will ensure that the appropriate system state is used for computing the event. Each approach will have different performance implications, and which approach to select for the DES should be considered in the context of the particular DES or DES environment.

Event Dispatching and Retrieval

One of the key factors in an efficient implementation of the SPE architecture of the invention is the mechanism employed for transferring control of events to the EPP's. If this task is performed on the same processor that supports the ELM, which performs final execution of events, overhead of the EPP's will reduce the total event throughput, since only one event at a time can be validated and go through the apply phase of execution. Thus, event dispatching should either be performed using a separate processor that has access to the event list information, or should be implemented with care for efficiency.

The goal of event dispatching for an event E, which is a UCE, is to provide an EPP with all of the state information that the EPP requires to make event E into a PCE. Once event E is pre-computed, its outputs must be returned somehow to the ELM in time for final execution. This mechanism is referred to as "event output retrieval."

Once event E is dispatched to the EPP, all of the inputs of event E must be accessible to the EPP. As noted earlier, it is difficult to know in advance which inputs event E will require prior to the actual computation of event E. Therefore, the EPP must either be provided with all possible input information or have access to this information on an as-needed basis.

Many different implementations are possible, and the efficiency of these mechanisms are highly dependent on the underlying architecture of the supporting hardware. For example, if all processors can share a single memory space, instead of transferring information about the UCE, only a reference to the UCE needs to be transferred to the EPP when the UCE is dispatched to the EPP. Because highly scalable hardware architectures may not provide this capability, some implementations of the SPE architecture require a message-based dispatching and retrieval mechanism.

Variations on the SPE Architecture

As one of ordinary skill will recognize, many options for implementing the SPE architecture of the invention are left open. Particular aspects of a particular DES and particular hardware can be taken advantage of to achieve important efficiency benefits. In addition to those already discussed in previous sections, the following three implementation-specific issues should be analyzed for possible efficiency gains and can be implemented using current technology.

First, event selection should be considered. When the ESP selects events from the event list for pre-computation, the ESP need not simply choose events in the order in which the ESP encounters the events. Instead, the ESP can intelligently choose events based on heuristics that attempt to maximize the gains of the SPE architecture. An important consideration here is the likelihood that the PCE will remain valid and become a UPCE, based on information such as the type of the event, the associated object, etc. Also, certain more computationally-intensive events may be advantageous to pre-compute, given equal overhead for event dispatching and retrieval. Event selection heuristics may be complex and highly dependent on specific knowledge concerning the DES.

Second, process assignments should be considered. A single process or separate process can implement both the ELM and the ESP. The ELM and the ESP can be implemented to run on a single processor or separate processors. Additional processors can be used for the verify, apply, and full execution phases, as illustrated in FIG. 2.

Third, dynamic distribution of state information should be considered. If an event-dispatching approach is used, which does not rely on centralized shared memory to store the state of the system, a variety of techniques can be used to improve the efficiency of accessing event inputs. For example, once an object or another part of the DES's state becomes associated with a particular processor, it may be most efficient to retain that information within that processor's private memory and to continue to dispatch events related to that object to the same processor on a preferential basis. Such an approach may reduce communication overhead for certain DE's. Over the course of the simulation, the state of the system becomes distributed in a dynamic way to the available processors. The applicability of such a technique is highly dependent on the nature of the DES and the supporting hardware architecture.

As a variation to the SPE architecture, alternatives to the ESP can be used. For example, instead of having the ESP assign UCE's to the EPP's, the EPP's can have access to the event list and themselves select UCE's to pre-compute. As another example, the ELM can perform the function of the ESP, and after an EPP polls the ELM for a UCE, the ELM can provide the EPP with a UCE. In general, for the invention, a UCE is transferred to an EPP, and this can be accomplished in a variety of ways.

As a variation to the SPE architecture, the events in the event list can be indicated with other labels, such as unprocessed, in-processing, and pre-processed. Further, the event list is not limited to only the three types of events described herein, but can comprise other types of events as necessary for the implementation of the DES.

As another variation to the SPE architecture, the event list can have multiple head events. The multiple head events can be indicated as uncomputed, in-computation, or pre-computed. The multiple head events can be concurrently validated or executed by one or more ELM's, if the multiple head events are "sufficiently independent." To be sufficiently independent, the output of each head event should not significantly affect the computations of the other head events. For example, if multiple events are labeled with the same simulation time (as in Table 1, where events E[1] and E[2] have the same time of 0.1) and arrive at the head of the event list, these multiple events can be deemed multiple head events and are sufficiently independent to be concurrently validated or executed. In general, using multiple head events involves application specific decisions about when the events are sufficiently independent, and can result in significant performance gains.

As an enhancement to the SPE architecture, the ELM can scan the event list for PCE's and apply the same methodology to the PCE in the event list as it does to the PCE that is a head event. For each PCE in the event list, the ELM determines whether the pre-computed work of the PCE is still valid. To select a PCE in the event list to verify, the ELM, or perhaps another process, can scan the event list periodically or non-periodically. Once selected, the ELM, or perhaps another processs, verifies the PCE in the event list. If the pre-computed work of the PCE is valid, the ELM does not modify the PCE. If the pre-computed work of the PCE is invalid, the ELM indicates the PCE as an ICE, and selects one of the EPP's to recompute the computation for the newly indicated ICE. The method for recomputing the computation is the same as that discussed above for computing a computation for an ICE.

As an alternative to verifying the PCE immediately after it is selected form the event list by the scanning ELM, the ELM can first determine whether the PCE has been verified recently before again verifying it. To accomplish this, for example, each PCE can include a time of verification indicator. The time of verification indicator is initially set to the time when the event's indication in the event list is changed from ICE to PCE. After the ELM selects the PCE to be verified, the ELM checks whether the PCE has been verified recently by comparing to a threshold the difference between the current time and the time of verification indicator for the PCE. If the difference is less than the threshold, the PCE is not verified because it was verified recently. If the difference is greater than or equal to the threshold, the PCE was not verified recently and is verified using the verification method discussed above. Once the PCE is verified, the time of verification indicator is changed to the current time. The time of verification for each PCE is initially set to the time at which the event was indicated as a PCE.

As an alternative to implementing the invention for DES, the invention can be implemented to increase the task throughput for any computer program implemented with a plurality of processors. In this alternative embodiment, the events are equivalent to tasks or sub-tasks. In other words, the execution speed of a computer program comprised of tasks and sub-tasks can be increased using a plurality of processors and the above methodology.

Further, the invention is applicable to any program that consists of a series of operations that have some degree of independence. As will be obvious to one of ordinary skill in the art, the extent to which these operations are independent is one of the factors determining the performance improvement that can be obtained. In many practical cases, DES's can be decomposed into events that are sufficiently independent to allow the approach of the invention to be utilized.

The invention has been described in detail with respect to preferred embodiments, and it will now be apparent from the foregoing to those skilled in the art that changes and modifications may be made without departing from the invention in its broader aspects, and the invention, therefore, as defined in the appended claims is intended to cover all such changes and modifications as fall within the true spirit of the invention.

What is claimed is:

1. A method for increasing the event throughput of a discrete-event simulation comprising the steps of:
   maintaining an event list for the discrete-event simulation, the event list comprising a head event; and
   determining whether the head event is uncomputed, in-computation, or pre-computed;
   if the head event is determined to be uncomputed, executing the head event;
   if the head event is determined to be in-computation, indicating the head event as pre-computed upon completion of a computation for the head event without affecting a system state of said discrete-event simulation; and
   if the head event is determined to be pre-computed, further determining whether the computation of the head event is valid or invalid;
      if the computation of the head event is determined to be valid, applying the computation of the head event; and
      if the computation of the head event is determined to be invalid, executing the head event.

2. A method according to claim 1, wherein the discrete-event simulation has a current system state, and the step of applying the computation of the head event if the computation of the head event is valid comprises changing the current system state based on the computation of the head event.

3. A method according to claim 1, wherein the step of determining whether the computation of the head event is valid or invalid uses input invariance.

4. A method according to claim 1, wherein the event list is an ordered collection of events.

5. A method according to claim 1, wherein the event list further comprises a plurality of events and at least one event indicated as uncomputed, the method further comprising the steps of:
   selecting one of the uncomputed events from the event list; and
   computing a computation for the selected uncomputed event.

6. A method according to claim 1, further comprising the steps of:
   indicating a plurality of events in the event list as head events; and
   determining concurrently whether each head event is uncomputed, in-computation, or pre-computed.

7. A method according to claim 6, further comprising prior to the step of indicating a plurality of events in the event list as head events, the step of:
   determining whether a plurality of events in the event list are sufficiently independent to be indicated as head events.

8. A method for increasing the event throughput of a discrete-event simulation comprising the steps of:
   maintaining an event list for the discrete-event simulation, the event list comprising a plurality of events and at least one event indicated as uncomputed;
   selecting an event indicated as uncomputed from the event list;
   transferring the selected event to an event pre-computation process;
   indicating the selected event in the event list as in-computation;
   computing a computation for the selected event using the event pre-computation process without affecting a system state of said discrete-event simulation;
   receiving the computation from the event pre-computation process; and
   indicating the selected event in the event list as pre-computed.

9. A method according to claim 8, wherein selecting an event indicated as uncomputed from the event list comprises scanning the event list for an event indicated as uncomputed.

10. A method according to claim 8, wherein the event pre-computation process selects the event from the event list.

11. A method according to claim 8, wherein transferring the selected event to an event pre-computation process comprises assigning the selected event to an event pre-computation process.

12. A method according to claim 8, further comprising the steps of:
indicating a plurality of pre-computed events as pre-computed head events for the event list; and
verifying each head event concurrently to determine if the head event is valid or invalid;
if the head event is valid, applying the computation of the head event; and
if the head event is invalid, executing the head event.

13. A method according to claim 8, wherein the discrete-event simulation has a current system state that is updated and wherein the step of computing a computation for the selected event using the event pre-computation process comprises the steps of:
providing the event pre-computation process with event inputs; and
determining a change to the system state based on the selected event and the event inputs;
wherein the step of receiving the computation from the event pre-computation process comprises receiving the event inputs and the change to the system state from the event pre-computation process; and
wherein the step of indicating the selected event in the event list as pre-computed comprises associating the event inputs and the change to the system state with the selected event.

14. A method according to claim 13, further comprising the steps of:
indicating the selected pre-computed event as a pre-computed head event for the event list;
verifying the head event to determine if the head event is valid or invalid;
if the head event is valid, applying the computation of the head event; and
if the head event is invalid, executing the head event.

15. A method according to claim 14, wherein the step of verifying the head event comprises comparing the current system state with the event inputs associated with the head event; and
wherein the step of applying the computation of the head event comprises updating the current system state using the change to the system state associated with the head event.

16. A method according to claim 14, wherein the step of verifying the head event to determine if the head event is valid or invalid uses input invariance.

17. A method for increasing the event throughput of a discrete-event simulation comprising:
maintaining an event list for the discrete-event simulation, the event list having a plurality of events indicated as pre-computed;
selecting an event indicated as pre-computed from the event list; and
determining whether the selected event is valid or invalid, said determination being carried out as follows:
if the selected event is invalid:
assigning the selected event to an event pre-computation process;
indicating the selected event in the event list as in-computation;
computing a computation for the selected event using the event pre-computation process without affecting a system state of said discrete-event simulation;
receiving the computation from the event pre-computation process; and
indicating the selected event in the event list as pre-computed.

18. A method according to claim 17, wherein the event list has a head event indicated as pre-computed with an associated computation, the method further comprising the steps of:
verifying the head event to determine if the head event is valid or invalid;
if the head event is valid, applying the associated computation of the head event; and
if the head event is invalid, executing the head event.

19. A computer system having at least one processor and code segments for performing a discrete-event simulation comprising:
means for maintaining an event list comprising a plurality of events, one event being indicated as a head event, each event being indicated as uncomputed, in-computation, or pre-computed;
means for carrying out at least one event pre-computation process for computing a computation for an uncomputed event without affecting a system state of said discrete-event simulation;
means for selecting an uncomputed event and transferring the uncomputed event to one of the event pre-computation processes; and
means for executing an uncomputed head event and verifying a pre-computed head event.

20. The computer system of claim 19, wherein at least one processor implements the means for maintaining an event list, the means for selecting an uncomputed event and transferring the uncomputed event, and the means for executing an uncomputed head event and verifying a pre-computed head event.

21. The computer system of claim 19, wherein a plurality of processors implements the means for computing a computation for an uncomputed event.

22. A computer-readable medium embodying code segments executable by a computer for performing a discrete-event simulation, the code segments comprising:
a code segment for maintaining an event list comprising a plurality of events, one event indicated as a head event, each event indicated as uncomputed, in-computation, or pre-computed;
a code segment for each of at least one event pre-computation process for computing a computation for an uncomputed event without affecting a system state of said discrete-event simulation;
a code segment for selecting an uncomputed event and transferring the uncomputed event to one of the event pre-computation processes to have a computation computed according to the event pre-computation process; and a code segment for executing an uncomputed head event and verifying a pre-computed head event.

23. A computer system having at least one processor and code segments for performing the method of claim 1.

24. A computer-readable medium having code segments executable by a computer for performing the method of claim 1.

25. A computer system having at least one processor and code segments for performing the method of claim 8.

26. A computer-readable medium having code segments executable by a computer for performing the method of claim 8.

27. A computer system having at least one processor and code segments for performing the method of claim 17.

28. A computer-readable medium having code segments executable by a computer for performing the method of claim 17.

* * * * *